United States Patent [19]

Tomita et al.

[11] Patent Number: 5,034,799
[45] Date of Patent: Jul. 23, 1991

[54] SEMICONDUCTOR INTEGRATED CIRCUIT DEVICE HAVING A HOLLOW MULTI-LAYERED LEAD STRUCTURE

[75] Inventors: Kenichi Tomita; Tomotoshi Inoue, both of Kanagawa; Toshiyuki Terada, Tokyo, all of Japan

[73] Assignee: Kabushiki Kaisha Toshiba, Kawasaki, Japan

[21] Appl. No.: 479,998

[22] Filed: Feb. 14, 1990

[30] Foreign Application Priority Data

Feb. 22, 1989 [JP] Japan ................................... 1-40198

[51] Int. Cl.⁵ ..................... H01L 23/48; H01L 23/50; H01L 23/52
[52] U.S. Cl. ......................................... 357/71; 357/68
[58] Field of Search ............................. 357/71, 68, 69; 361/414

[56] References Cited

U.S. PATENT DOCUMENTS

| | | | |
|---|---|---|---|
| 3,647,585 | 3/1972 | Fritzinger et al. | 357/71 |
| 3,890,636 | 6/1975 | Harada et al. | 357/68 |
| 3,925,880 | 12/1976 | Rosvold | 357/69 |
| 4,899,435 | 2/1990 | Potter et al. | 361/414 |

FOREIGN PATENT DOCUMENTS 57-133648 8/1982 Japan.
60-244045 12/1985 Japan.

*Primary Examiner*—Rolf Hille
*Assistant Examiner*—S. V. Clark
*Attorney, Agent, or Firm*—Oblon, Spivak, McClelland, Maier & Neustadt

[57] ABSTRACT

A highly reliable semiconductor integrated circuit device having a hollow multi-layered lead structure is provided. The device comprises lead-supporting columns that can securely support the multi-layered leads and can also efficiently radiate heat generated in operation.

10 Claims, 7 Drawing Sheets

SEMICONDUCTOR INTEGRATED CIRCUIT DEVICE HAVING A HOLLOW MULTI-LAYERED LEAD STRUCTURE

BACKGROUND OF THE INVENTION

1. Field of the Invention

This invention relates to a semiconductor integrated circuit device, and more particularly to a semiconductor integrated circuit device having a hollow multi-layered lead structure supported by columns formed on a semiconductor substrate.

2. Description of the Prior Art

In recent years, a large number of ICs (integrated circuit) superior in high-speed operation characteristics have been used for supercomputers and communication systems. To achieve the high-speed operation characteristics, such ICs have been improved in terms of element structures. Particularly, the hollow multi-layered leads have been developed to effectively reduce distributed capacity between the leads.

A conventional IC having as hollow multi-layered lead structure will be described in the order of manufacturing processes with reference to cross-sectional views of FIGS. 7A through 7E. In FIG. 7A, an MOS-type field-effect transistor (MOS-FET) 13 and a diffusion layer 14 are formed in a region surrounded by a field insulating film 12 on a silicon substrate 11. An SiO$_2$ film which becomes a first interlayer insulating film 15a is formed on the entire surface of the substrate 11. First, second and third openings, 16a, 16b and 16c are made in the insulting film 15a at positions corresponding respectively to the MOS-FET 13, the field insulating film 12 and the diffusion layer 14.

Next, Al is deposited on the entire surface of the substrate 11, and the thus deposited Al is selectively eliminated leaving prescribed portions. As a result, a first lead layer 17a is formed on the substrate 11, as shown in FIG. 7B. Specifically, the first lead layer 17a is formed in the openings 16a, 16b and 16c, and on the surface of the first interlayer insulting film 15a. Thus, the first lead layer 17a is connected to the MOS-FET 13 and the diffusion layer 14 so as to form first and second contact portions 18a and 18b. Further, the first lead layer 17a reaches the surface of the field insulating film 12 piercing through the second opening 16b, and constitutes a first lead supporting column 19a.

Thereafter, an SiO$_2$ film is deposited on the entire surface of the substrate 11, and then a second interlayer insulating film 15b is formed, as shown in FIG. 7c. Further, fourth, fifth and sixth openings 16d, 16e and 16f are made in the second interlayer insulating film 15b so as to expose the surfaces of the field insulting film 12 and the first lead layer 17a. The fourth opening 16d penetrates not only through the second interlayer insulating film 15b, but also the first interlayer insulating film 15a. Thus the fourth opening 16d is deeper than the fifth and sixth openings 16e and 16f.

Next Al is deposited on the entire surface of the substrate 11, and then a second lead layer 17b is formed, as shown in FIG. 7D. Specifically, the second lead layer 17b constitutes third and fourth contact portions 18c and 18d piercing through the fifth and sixth openings 16e and 16f. Further, the layer 17b constitutes a second lead-supporting column 19b piercing through the fourth opening 16d. However, the fourth opening 16d is deeper than the fifth and sixth openings 16e and 16f. Thus Al does not reach the bottom of the fourth opening 16d. In other words, the fourth opening 16d cannot be completely filled up with the Al.

Finally, the first and second interlayer insulating films 15a and 15b are eliminated by etching. As a result, a hollow multi-layered lead structure can be completed, as shown in FIG. 7E. In this structure, space between the multi-layered leads is filled with a vacuum, or gas having a low dielectric constant. Thus, the lead capacitance can be reduced, and this is advantageous to achieve the high-speed operation characteristics of ICs.

However, the above-described conventional hollow multi-layered lead structure has the following disadvantages. Specifically, the first and second lead layers 17a and 17b are generally being exposed to a gas or gases having a low thermal conductivity. Thus, it is difficult to effectively radiate the head generated in operation. Particularly, the heat generated concentrically in cavity portions A, B and C (encircled by the dotted lines) cannot be easily radiated. In other words, the cross-sectional areas of leads in this region decrease, thus increasing the resistance thereof. As a result, the portions A, B and C are locally heated and reach a high temperature, potentially resulting in the melt between the second lead layer 17b and the second lead-supporting column 19b. In the worst case, the second lead layer 17b per se would be disconnected.

Moreover, the Al cannot reach the bottom of the opening 16d which is deeper than other openings 16e and 16f. Thus, the Al is missing from the lower portion of the second lead-supporting column 19b, as shown in FIG. 7E. Thus, the column 19b can no longer support the second lead layer 17b. As a result, the second lead layer 17b is inevitably bent, and short-circuited to the first lead layer 17a. The missing of Al becomes significant as the number of multi-layers increases.

SUMMARY OF THE INVENTION

Accordingly, one object of this invention is to provide a semiconductor integrated circuit device having hollow multi-layered leads supported by highly reliable columns. The columns are constituted so as to avoid the current concentration in particular local portions, and also to be superior in mechanical strength.

Another object of this invention is to provide a method of manufacturing a semiconductor integrated circuit device, in which highly reliable lead-supporting columns can be easily formed.

Briefly, in accordance with one aspect of this invention, there is provided a semiconductor integrated circuit device having lead layers supported by lead-supporting columns formed on a substrate in such a manner that said lead layers are covered with a vacuum or gas, wherein said lead-supporting columns are electrically conductive, and have portions different in thickness.

BRIEF DESCRIPTION OF THE DRAWINGS

A more complete appreciation of the invention and many or the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
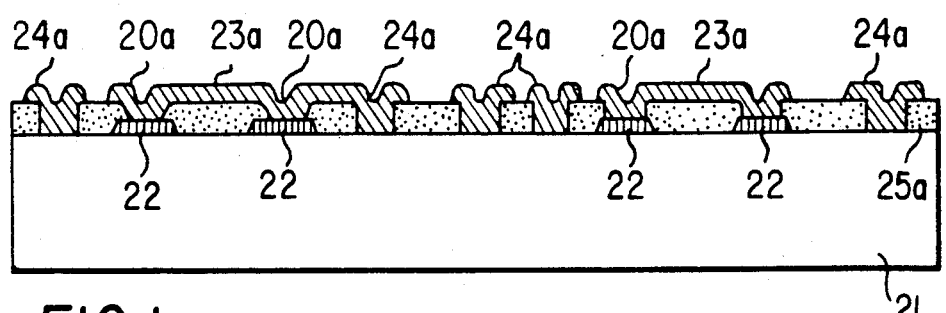
FIGS. 1A through 1D are cross-sectional views illustrating the manufacturing processes of a first embodiment according to the present invention.

Referring now to the drawings, wherein like reference numerals designate identical or corresponding parts throughout the several views, and more particularly to FIG. 1 thereof, one embodiment of this invention will be described. For the sake of simplicity, the description as to diffusion layers and element components formed on a semiconductor substrate will be omitted.

FIGS. 1A through 1D are cross-sectional views sequentially illustrating the processes of manufacturing a GaAs integrated circuit according to a first embodiment of the present invention. A diffusion layer (not shown) is provided on the surface of a semi-insulating GaAs substrate 21, and then plural electrodes 22 are formed on the diffusion layer. As a result, an element such as a Schottky gate-type field effect transistor is completed. Thereafter, an $SiO_2$ film is deposited on the entire surface of the substrate 21 so as to form a first interlayer insulating form 25a. A plurality of openings are then made in the film 25a at prescribed positions. Thereafter, Al is deposited on the entire surface of the substrate 21, and then processed by etching. As a result, a first lead layer 23a, and first contact portions 20a that make contact between first lead-supporting columns 24a and the electrodes 22 are respectively formed. In this process, each of the first lead-supporting columns 24a is prepared in a shape suitable to be as portion of as higher column which will be formed in the subsequent process, as shows in FIG. 1A.

Figure 1B:
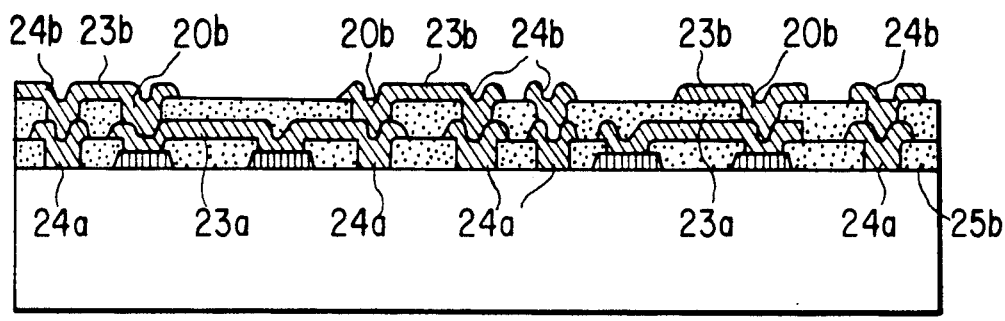

Further, an $SiO_2$ film is deposited on the entire surface of the substrate 21 so as to form a second interlayer insulating film 25b. A plurality of openings are then made in the film 25b at prescribed positions corresponding to the first lead-supporting columns 24a and the first lead layer 23a, respectively. Thereafter, Al is deposited on the entire surface of the substrate 21, and then processed by etching. As a result, a second lead layer 23b, and second contact portions 20b that make contact between second lead-supporting columns 24b and the first lead layer 23a are respectively formed, as shown in FIG. 1B. Here, the second lead-supporting columns 24b are thinner than the first lead-supporting columns 24a.

Figure 1C:
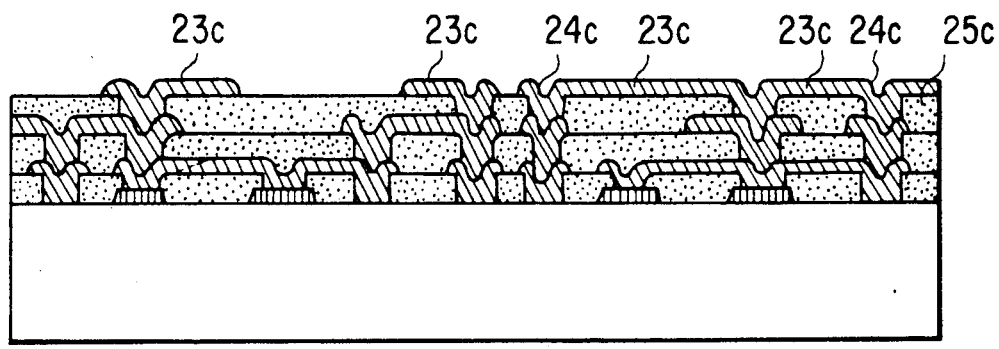

Thereafter, a third interlayer insulating film 25c, a third lead layer 23c, third lead-supporting columns 24c and third contact portions 20c are respectively formed in the same manner as that in the process shown in FIG. 1B, as shown in FIG. 1C. Here, the third lead-supporting columns 23c are thinner than the second lead-supporting columns 23b.

Figure 1D:
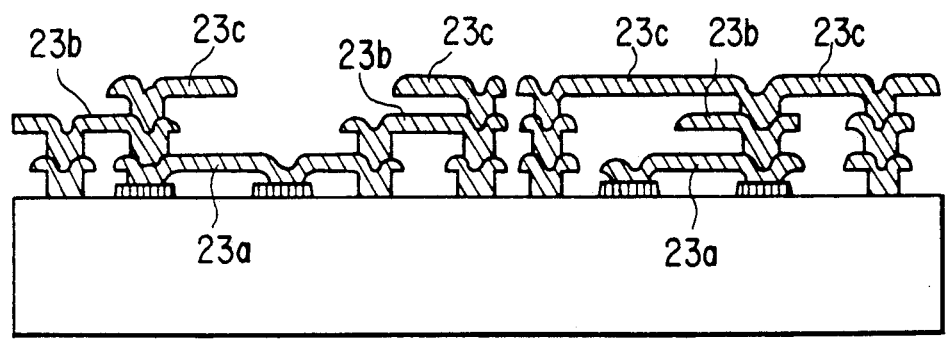

Finally, the first, second and third interlayer insulating films 25a, 25b and 25c are eliminated by use of a wet-etching technique. As a result, a hollow multi-layered lead structure comprising the first, second and third lead layers 23a, 23b and 23c can be completed, as shown in FIG. 1D. In FIG. 1D, the third lead layer 23c is supported by the three lead-supporting columns 24a, 24b and 24c which have been sequentially stacked. The columns 24a, 24b and 24c become thicker toward the substrate 21. Thus, the total surface area of the columns 24a, 24b and 24c can be greater than that of the conventional columns by about 50% through 100%, or more increase can be obtained in some cases. As a result, the heat generated in operation can be quickly radiated, thereby preventing the disconnection of the hollow leads. Further, the columns 24a, 24b and 24c can be formed in the same processes as the conventional patterning processes. In other words, no additional processes are required.

Moreover, in the conventional techniques, it has been extremely difficult to form columns in a well-aligned shape particularly when more than three lead layers must be formed. However, in this embodiment according to the present invention, the stacked columns and hollow leads, which are superior in mechanical strength can be easily formed even when more than three layers are desired.

Figure 2A:
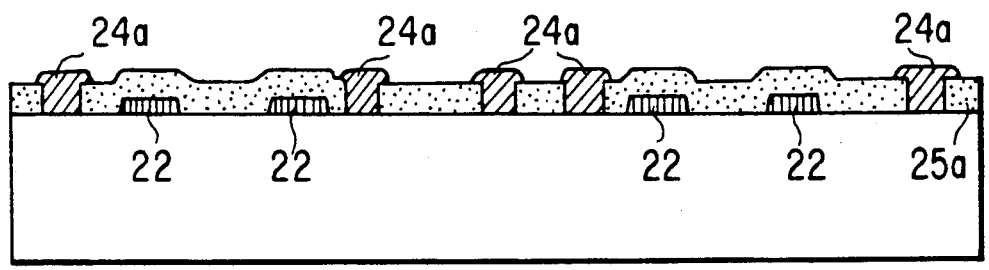
FIGS. 2A through 2F are cross-sectional views illustrating the manufacturing processes of a second embodiment according to the present invention.

Next, a second embodiment according to the present invention will be described with reference to FIGS. 2A through 2F. Hereinafter, the description of the same portion as above will be omitted. As shown in FIG. 2A, a first interlayer insulating film 25a is formed on a substrate 21 in the same manner as in the first embodiment. A plurality of openings are them made in the insulating film 25a. Thereafter, tungsten (W) is deposited filling up the openings so as to form lead-supporting columns 24a. This is performed by the use of a selective CVD (chemical vapor deposition) technique. In this case, the columns 24a are grown slightly higher than the height of the insulating film 25a, thus resulting in umbrella-shaped heads.

Further, other openings are made in the first interlayer insulating film 25a at prescribed positions corresponding to electrodes 22. Thereafter, Al is deposited on the entire surface of the substrate 21, and the thus deposited Al is etched so as to form a desired lead pattern. As a result, a first lead layer 23a is formed. An $SiO_2$ film 26 is then deposited on the entire surface of the substrate 21. Further, a photo-resist 27 is coated on the $SiO_2$ film 26 such that the entire surface thereof is substantially evened, as shown in FIG. 2B.

Figure 2B:
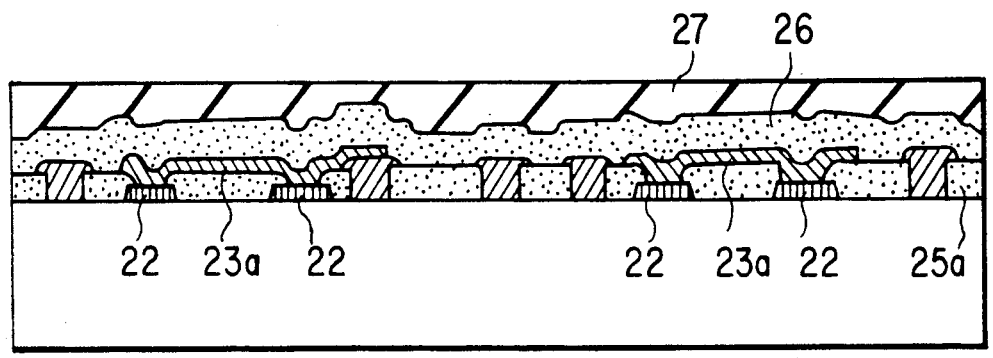
Figure 2C:
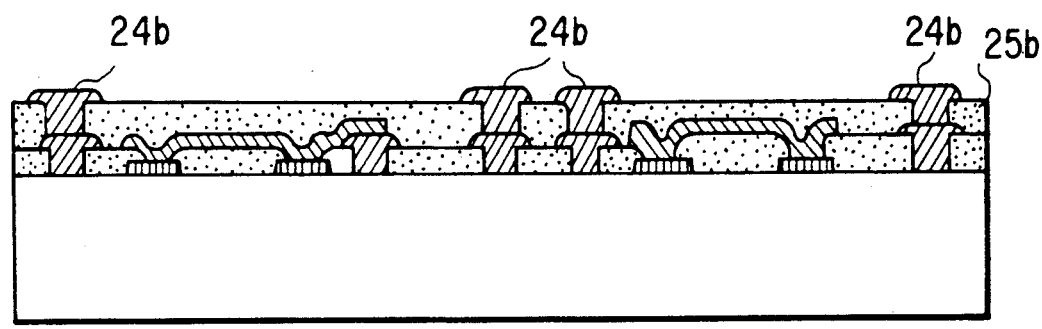

In FIG. 2c, the photo-resist 27 is etched and further the $SiO_2$ film 26 is eliminated to such an extent that the surface of the film 26 is substantially evened. This is performed by the use of an etch-back technique. As a result, a second interlayer insluting film 25b is formed. Thereafter, lead-supporting columns 24b are formed in the same manner as in the process of FIG. 2A. In this embodiment, the second lead-supporting columns 24b are also thinner than the first lead-supporting columns 24a, the same as in the first embodiment.

Figure 2D:
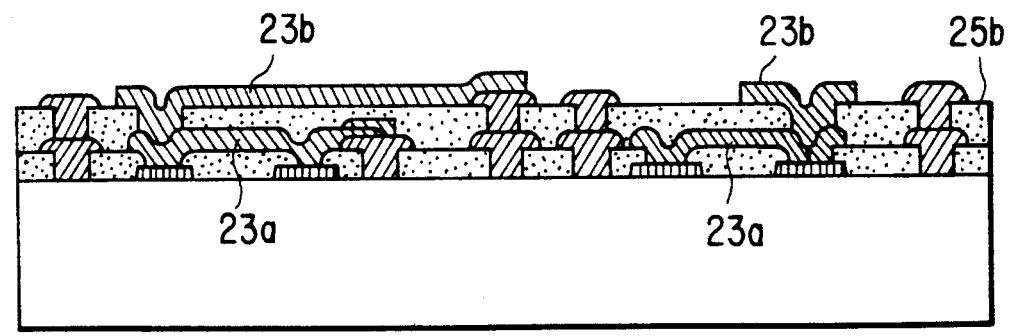

As shown in FIG. 2D, other openings are made in the second interlayer insulating film 25b at prescribed positions. Thereafter, a second lead layer 23b is formed in the same manner as in the process in FIG. 2B.

Figure 2E:
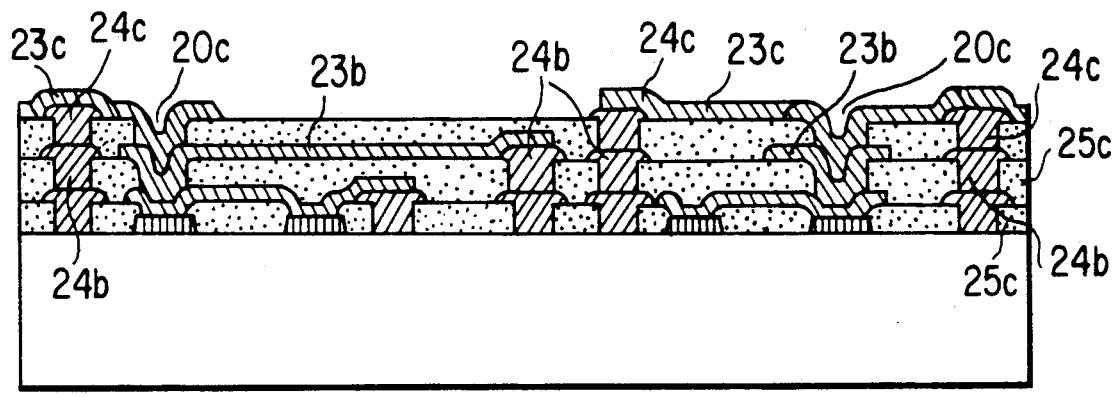

As seen from FIG. 2E, a third interlayer insulating film 25c is formed evenly on the entire surface of the substrate 21 in the same manner as in the processes of FIGS. 2B and 2C. Thereafter, other openings are made in the third interlayer insulating film 25c at prescribed positions corresponding to the second lead-supporting columns 24b. Next, W is deposited filling up the openings in the film 25c so as to form lead-supporting columns 24c. This is performed by use of the selective CVD technique. Thereafter, other openings are made in the form 25c at prescribed positions. Further, Al is deposited on the entire surface of the substrate 21. The thus deposited Al is etched into a desired lead pattern. As a result, a third lead layer 23c and contact portions 20c, which made contact between the layers 23b and 23c, are formed respectively.

Figure 2F:
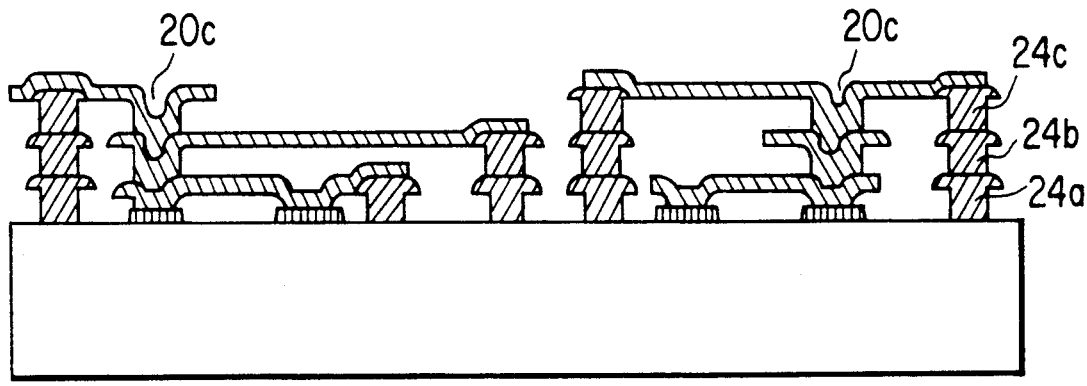

Finally, the first, second and third interlayer insulating films 25a, 25b and 25c are eliminated by use of the wet-etching technique. As a result, a three-layer hollow lead structure can be completed, as shown in FIG. 2F.

The GaAs integrated circuit device manufactured according to the method of this embodiment has the same advantages as those in the first embodiment. Moreover, in this embodiment the stacked lead-supporting columns are made of W harder than Al which is the material of lead layers. Thus, the respective lead layers can be firmly supported by the columns made of W without deformation even when more than three layers are formed. Further, the W-made columns have a high melting point. Thus, such columns are free from damage which might be caused by heat generated in operation. In the case of the Al-made columns, such heat potentially causes so-called electro-migration therein, thus resulting in deformation.

Figure 3:
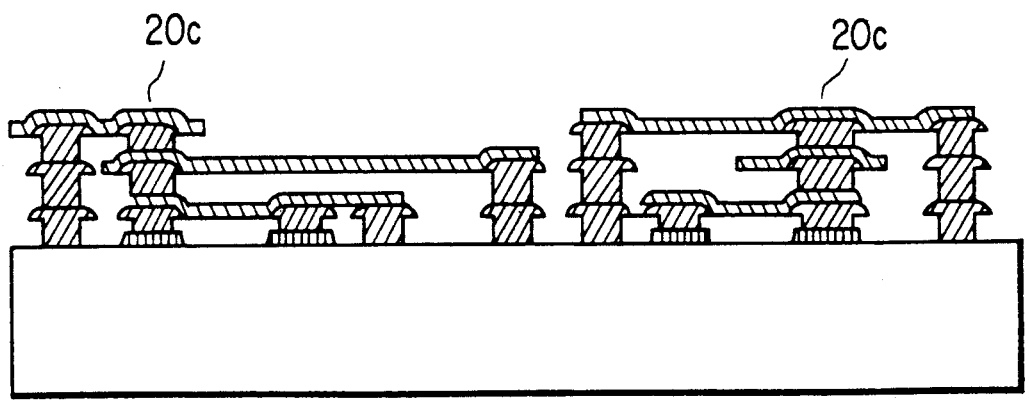
FIG. 3 is a cross-sectional view illustrating a third embodiment according to the present invention.

Next, a third embodiment according to the present invention will be described with reference to FIG. 3. As seen from FIG. 3, contact portions 20c are formed in the same process in which lead-supporting columns are formed by the use of the same selective CVD technique. The device manufactured according to this embodiment has the same advantages as those in the second embodiment. Moreover, all the portions connected between the respective leads are made of W. Therefore, the device in this embodiment has a mechanical strength greater than that of the device in the second embodiment, thus resulting in higher reliability.

Figure 4:
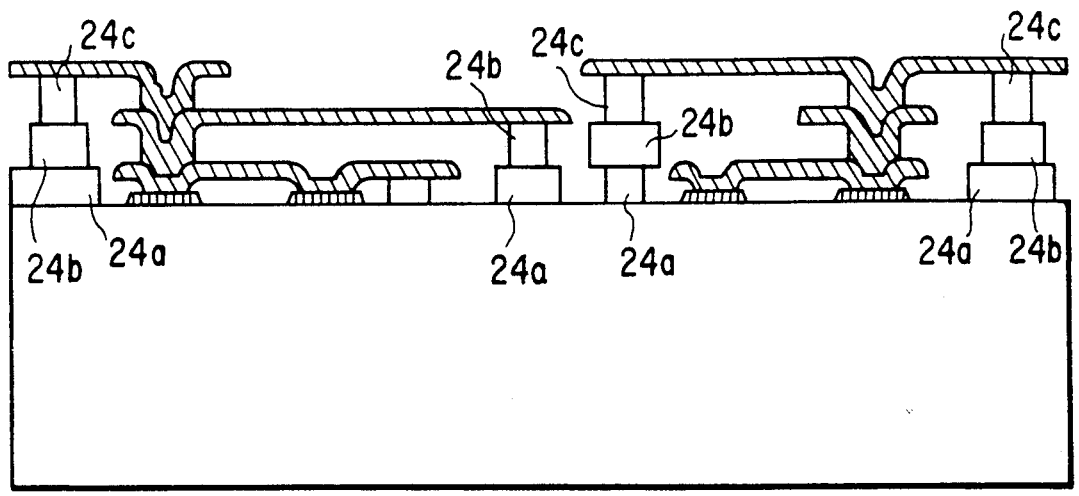
FIG. 4 is a cross-sectional view illustrating a fourth embodiment according to the present invention.

Next, a fourth embodiment according to the present invention will be described with reference to FIG. 4. In this embodiment, lead-supporting columns 24a, 24b and 24c are made of W, and are formed in the same selective CVD techniques as in the second and third embodiments. However, in this embodiment, each column of the stacked columns differs in thickness. Specifically, the lower the column, the greater in thickness. As a result, the total surface areas of the stacked columns increases. Moreover, each lead of the respective layer can be securely supported. As a result, a stable multi-layer structure can be obtained. In another modification, the middle portion of the stacked may be formed with a thickness greater than that of the other portions so as to increase the total surface area.

Figure 5A:
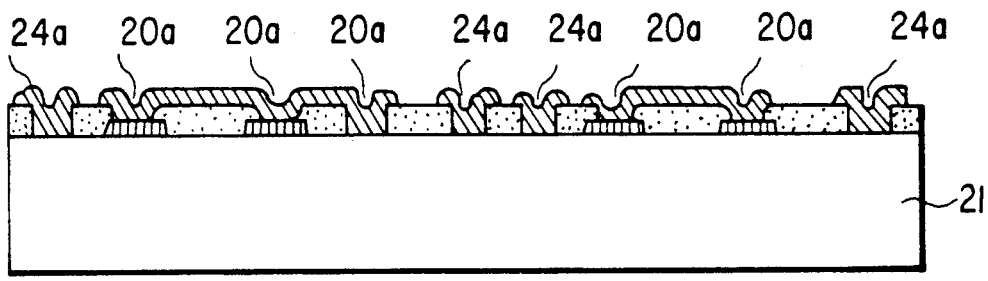
FIGS. 5A through 5C are cross-sectional views illustrating the manufacturing processes of a fifth embodiment according to the present invention.
Figure 5B:
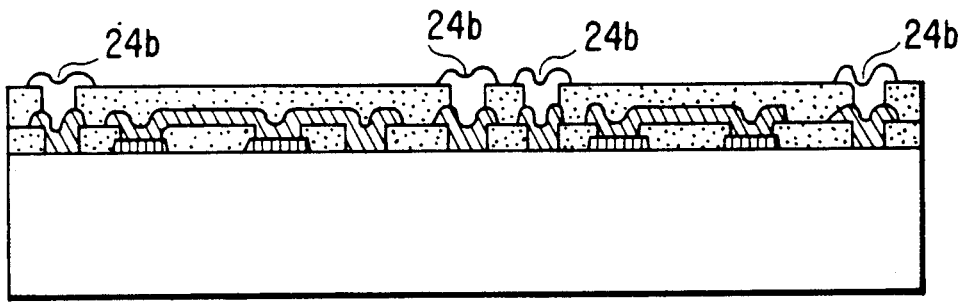
Figure 5C:
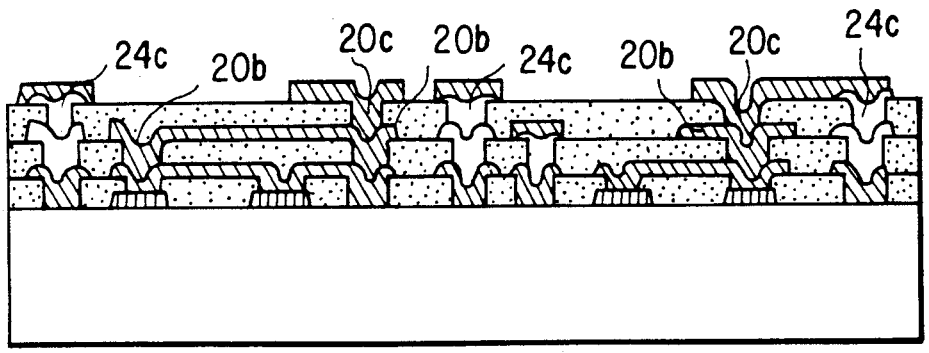

Next, a fifth embodiment according to the present invention will be described with reference to FIGS. 5A through 5C. In the second and third embodiments, the lead-supporting columns of W are formed by use of the selective CVD technique. However, in this embodiment, lead-supporting columns are formed by use of a non-electrolytic plating technique, which is simpler than the selective CVD technique. Specifically, Au, Cu Pt, Ni, Rh and the like are used as the material of the lead-supporting columns in the non-electrolytic plating technique. As seen from FIG. 5A, first lead-supporting columns 24a are made of Al (which is the material of leads) in the same processes as that of first contact portions 20a. By virtue of the non-electrolytic plating, the metal material of the lead-supporting columns are not deposited directly on the surface of the substrate 21. Thus, the first lead-supporting columns alone are formed in the same processes as that of the contact portions. The prescribed metal is deposited on the surface of Al by the use of the non-electrolytic plating technique. Thereafter, second lead-supporting columns alone are formed by the non-electrolytic plating technique, as shown in FIG. 5B. Next, second contact portions 20b are formed, as shown in FIG. 5C. Thereafter, third lead-supporting columns 24c are formed, and then third contact portions 20c are formed.

Figure 6A:
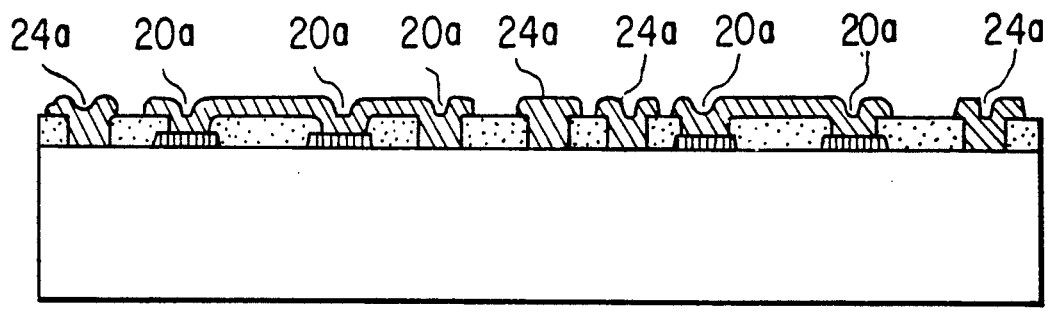
FIGS. 6A through 6C are cross-sectional views illustrating the manufacturing processes of a sixth embodiment according to the present invention.
Figure 6B:
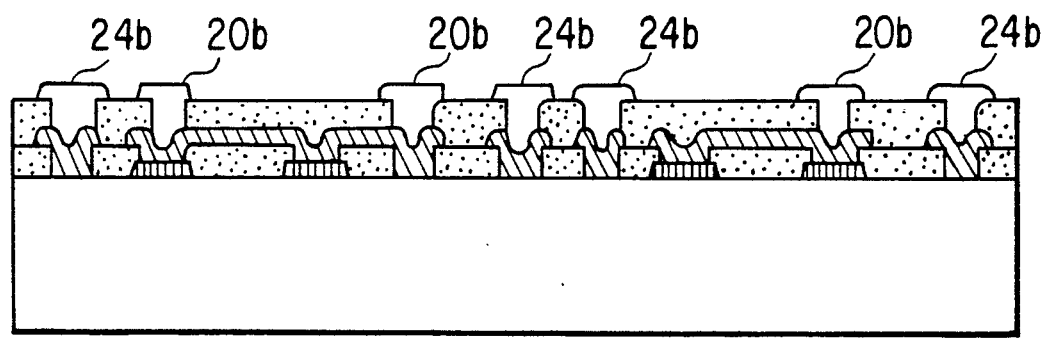
Figure 6C:
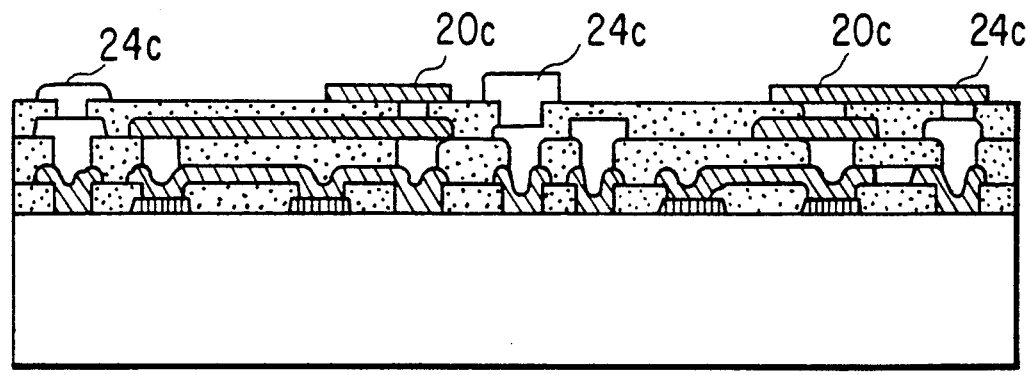
Figure 7A:
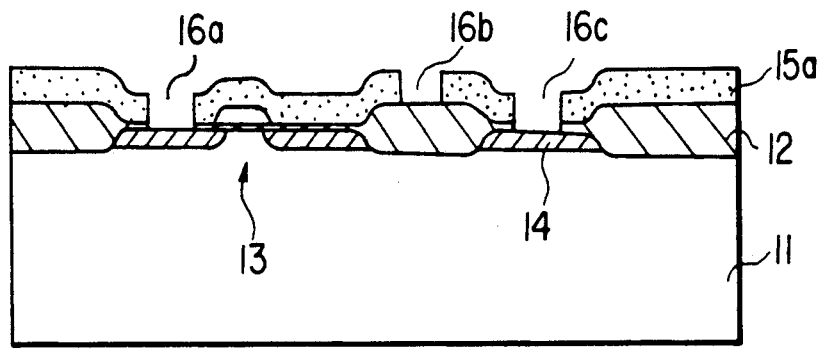
FIGS. 7A through 7E are cross-sectional views illustrating the manufacturing processes of as conventional device.
Figure 7B:
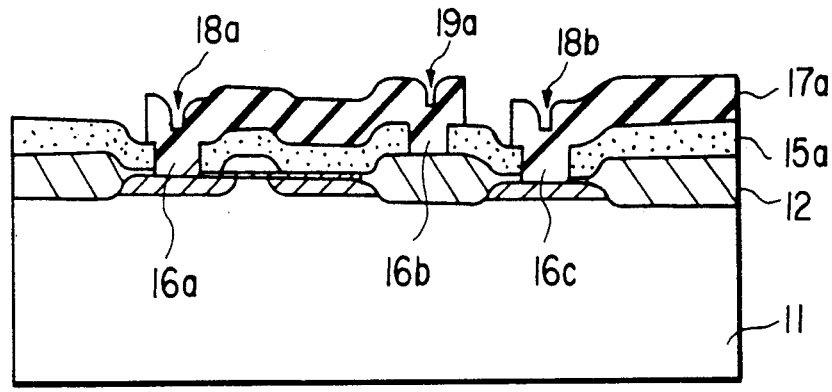
Figure 7C:
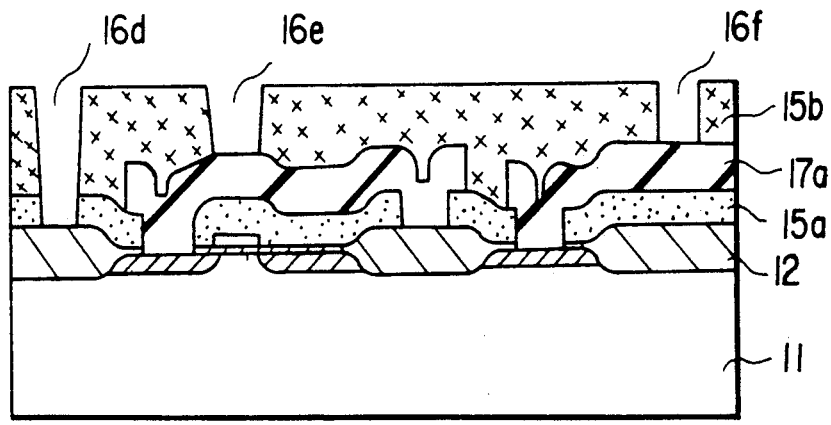
Figure 7D:
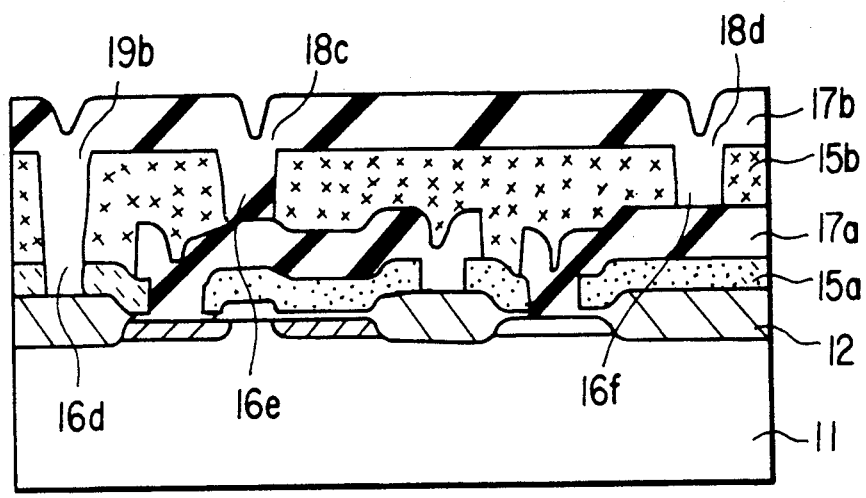
Figure 7E:
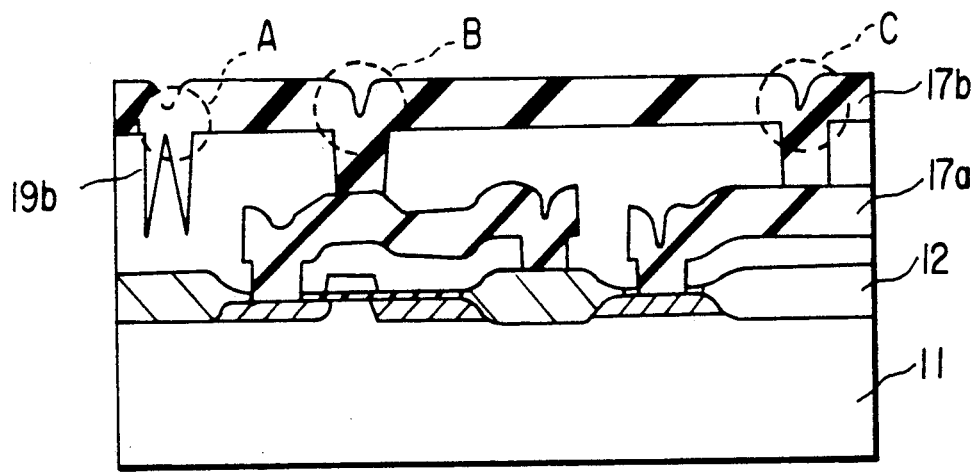

Next, a sixth embodiment according to the present invention will be described with reference to FIGS. 6A through 6C. In this embodiment, first lead-supporting columns 24a and first contact portions 20a of Al are formed in the same processes as above, as shown in FIG. 6A. Thereafter, second lead-supporting columns 24b and second contact portions 20b are formed in the same processes as above by use of the non-electrolytic plating technique, as shown in FIG. 6B. Next, third lead-supporting columns 24c and third contact portions 20c are formed in the same processes as above by use of the non-electrolytic plating technique, as shown in FIG. 6C. In this embodiment, the manufacturing processes can be simplified when compared to the fifth embodiment.

In the above-described embodiments, the substrate made of GaAs is employed, however, substrates made of other compound semiconductor such as InP may be employed, and Si or Ge may also be used. However, a substrate made of Si generally exhibits conductive properties unlike a GaAs substrate which exhibits semi-insulating properties. Thus, an insulating film must be interposed between lead-supporting columns and the substrate. Moreover, the leads are made of Al in this invention, however, other materials may be used, such as an alloy of Al and Si or Al and Cu, and Au as a major component. Further, the structure of leads per se is not limited to a single layer, but may also be a three-layer structure of Ti (bottom), Pt and Au (top), for example. The lead-supporting columns may be made of any materials containing metal having high thermal conductivity. Such materials may be $WSi_2$, $MoSi_2$ and $TiSi_2$ other than Al and W.

As described above, according to the present invention, there can be easily provided a semiconductor device having highly reliable lead-supporting columns that can securely support the multi-layered leads, and can also efficiently radiate heat generated in operation.

Obviously, numerous additional modifications and variations of the present invention are possible in light of the above teachings. It is therefore to be understood that within the scope of the appended claims, the invention may be practiced otherwise than as specifically described herein.

What is claimed is:

1. In a semiconductor integrated circuit device having lead layers supported by lead-supporting columns formed on a substrate in a manner that the lead layers are covered with one of a vacuum and gas, the improvement comprising:

a first lead-supporting column portion at the substrate having a first width; and a second lead-supporting column portion, formed on the first column portion, the second lead-supporting column portion having a second width which is smaller than the first width of the first lead-supporting column portion;

wherein the first and second column portions are covered by one of the vacuum and gas; and Wherein a total surface area of the first and second column portions are greater than that of a conventional column structure having a substantially uniform width so that heat generated in operation is radiated at a greater rate than radiated by the conventional column structure.

2. The device of claim 1, wherein said lead-supporting columns become thicker toward said substrate.

3. The device of claim 1, wherein said lead-supporting columns are made of Al.

4. The device of claim 1, wherein said lead-supporting columns are made of W.

5. The device of claim 1, wherein said lead-supporting columns include at least one of Au, Cu, Pt, Rh, and Ni.

6. The device of claim 3, wherein said substrate includes a compound semiconductor.

7. The device of claim 4, wherein said substrate includes a compound semiconductor.

8. The device of claim 1, wherein an upper portion of the first lead-supporting column is provided with a depression for engaging a lower portion of the second lead-supporting column in an interdigitating manner.

9. In a semiconductor integrated circuit device having lead layers supported by lead-supporting columns formed on a substrate having an insulating layer thereon in a manner that the lead layers are covered with one of a vacuum and gas, the improvement comprising:

a first lead-supporting column portion, formed on the insulating layer of the substrate, having a first width; and a second lead-supporting column portion, formed on the first column portion, the second lead-supporting column portion having a second width which is smaller than the first width of the first lead-supporting column portion;

wherein the first and second column portions are covered by one of the vacuum and gas; and wherein a total surface area of the first and second column portions are greater than that of a conventional column structure having a substantially uniform width so that head generated in operation is radiated at a greater rate than radiated by the conventional column structure.

10. The device of claim 9, wherein an upper portion of the first lead-supporting column is provided with a depression for engaging a lower portion of the second lead-supporting column in an interdigitating manner.

* * * * *